United States Patent
Robinson

(10) Patent No.: US 6,518,893 B1
(45) Date of Patent: Feb. 11, 2003

(54) METHOD AND APPARATUS FOR MULTILEVEL SIGNAL OPERATION

(75) Inventor: Moises E. Robinson, Austin, TX (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/939,075

(22) Filed: Aug. 24, 2001

(51) Int. Cl.$^7$ ................................................ H03M 5/16
(52) U.S. Cl. ......................................... 341/56; 375/286
(58) Field of Search .............................. 341/56; 375/286

(56) References Cited

U.S. PATENT DOCUMENTS

| | | | | |
|---|---|---|---|---|
| 5,351,271 A | * | 9/1994 | Coquerel | ...................... 375/10 |
| 5,521,941 A | * | 5/1996 | Wiatrowski | .................. 375/287 |
| 5,737,365 A | * | 4/1998 | Gilbert et al. | ............... 375/224 |
| 5,793,815 A | | 8/1998 | Goodnow et al. | |
| 5,982,813 A | * | 11/1999 | Dutta et al. | .................. 375/219 |
| 6,005,895 A | | 12/1999 | Perino et al. | |
| 6,075,476 A | | 6/2000 | Johnson et al. | |
| 6,078,627 A | | 6/2000 | Crayford | |

* cited by examiner

Primary Examiner—Howard L. Williams
(74) Attorney, Agent, or Firm—Timothy W. Markison; Garlick & Harrison; H. C. Chan

(57) ABSTRACT

A method and apparatus for multilevel signaling includes processing that begins by determining multilevel signaling operation conditions. The processing then continues by generating an adjust signal based on the determined multilevel signaling operation conditions. The adjust signal is used to change the magnitude of the multilevel signals produced via the multilevel encoding. The adjust signal may vary a supply voltage and/or vary gain of an amplifier stage.

43 Claims, 9 Drawing Sheets

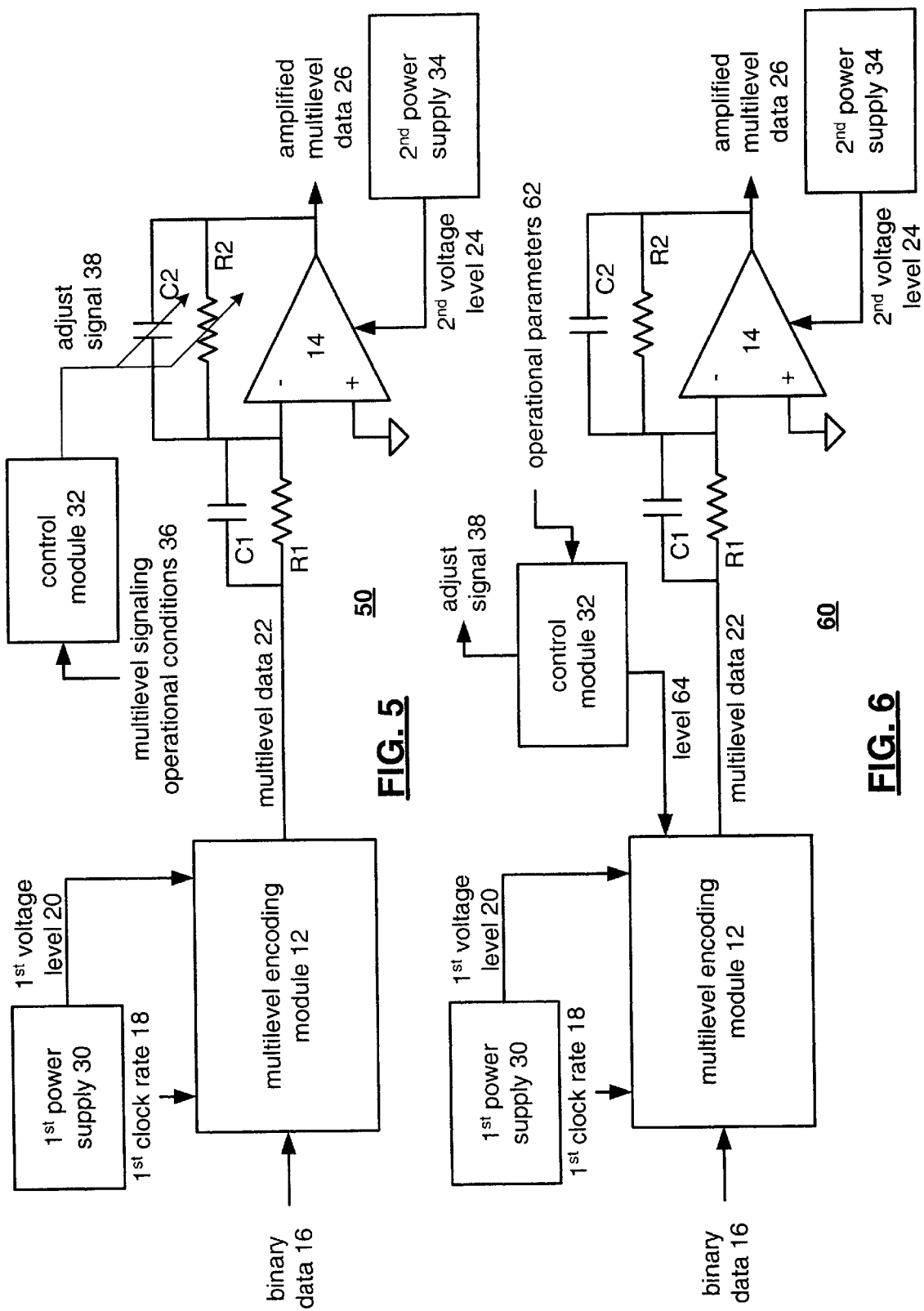

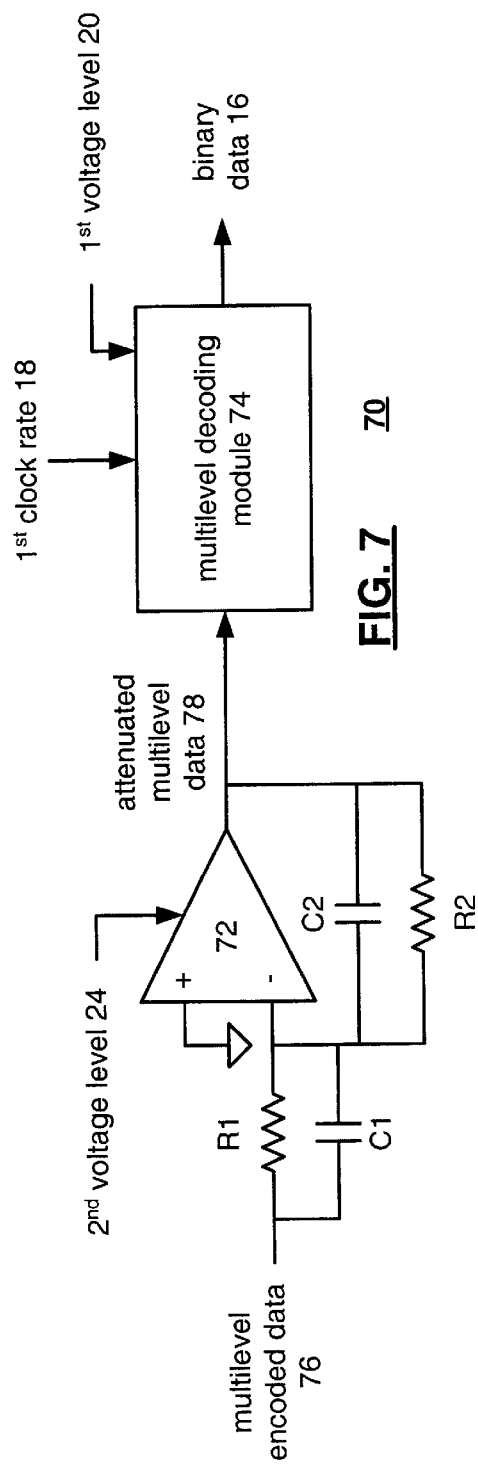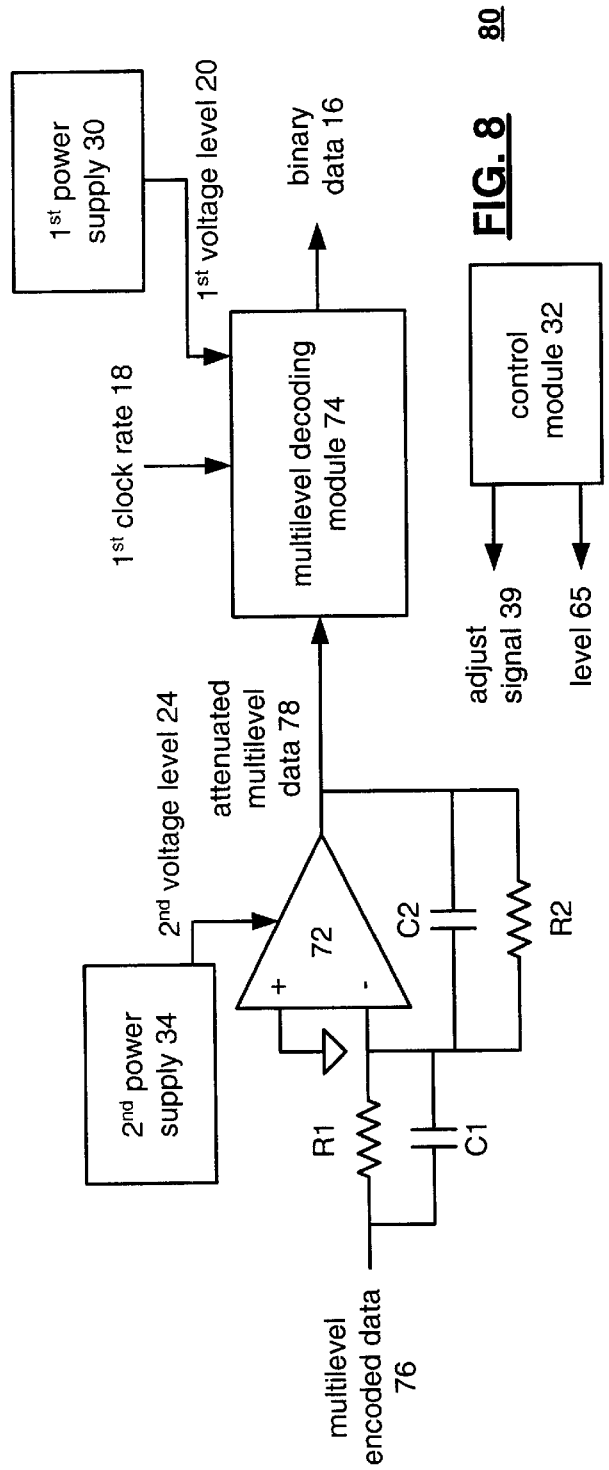

METHOD AND APPARATUS FOR MULTILEVEL SIGNAL OPERATION

TECHNICAL FIELD OF THE INVENTION

This invention relates generally to data transmission and in particular to data transmission of multilevel encoded data.

BACKGROUND OF THE INVENTION

High-speed serial buses are used in a wide variety of applications, including computer networking, telecommunication systems, and the Internet. With all such applications, the objective is to transport, from one entity to another, as much data as possible, as fast as possible, and as accurately as possible. To help universally adhere to this objective, many standards have been developed. For example, there is a multitude of standards regarding Ethernet. The various standards cover serial transmissions of data at various data rates (e.g., 10 megabits per second, 100 megabits per second, 1 gigabit per second, et cetera) and/or cover various transmission mediums (e.g., twisted copper lines, coaxial cable, and/or fiber optics).

As is known, a serial transmission of data passes one-bit of data per clock cycle, or transmission interval. As the bit rate increases into the multi-gigabit per second range, many issues arise. For instance, high-speed low-jitter clock circuits are difficult to design, and, as such, costly to develop and manufacture. The same is true for data recovery circuits. Another issue for multi-gigabit per second transmission concepts is that when transmitted over copper wires and/or traces, the transmission distance is limited due to the transmission line characteristics of the copper wire and/or traces.

As an alternative to high-speed serial buses, one could use a parallel bus, which transmits several bits of data over several lines from one entity to another in a single clock cycle, or transmission interval. As such, the clock rate can be reduced for parallel bus transmissions, in comparison to serial bus transmissions, while maintaining the same data throughput at the cost of extra lines and extra power consumption. As is known, each line in a parallel bus must be driven to mitigate the transmission line effects. As such, each additional line in a parallel bus increases power consumption over a serial bus.

Another alternative to a traditional high-speed serial bus is to transport multilevel encoded data over the high-speed serial bus. As is known, multilevel encoding uses various voltage levels to indicate the value of data being currently transmitted. For example, four different voltage levels can be used to represent two bits of information. For example, one level may be used to represent the digital value 00, a $2^{nd}$ level to represent the digital value 01, a $3^{rd}$ level to represent the digital value 10, and a $4^{th}$ level to represent the digital value of 11.

For accuracy of transmission, the difference between each of the levels should be significant enough to readily distinguish them apart at the receiving end. As is known, the multilevel encoded data will be somewhat distorted as a result of the transmission characteristics of the path it traverses to reach the receiving end. If, as a result of the distortion, the receiving end cannot accurately distinguish the different voltage levels of the multilevel encoded data, the data cannot be accurately recaptured. Intuitively, the more levels of encoding used, the more difficult it is to accurately recover the data. Thus, multilevel encoding many not be usable in some applications, and in most of the applications it is usable, only a four level encoding scheme is employed.

The use of multilevel encoding is further complicated by the ever-increasing improvements in integrated circuit manufacturing processes, which restrict the normal "thin-oxide" transistors in the process to be powered by smaller and smaller voltages. (Slower "thicker-oxide" transistors may still be powered by larger voltages.) Currently, 0.10 micron CMOS technology restricts the fast thin-oxide transistors in integrated circuits to be powered from a voltage supply of approximately 1 volt. If this voltage were used for a 4 level multilevel encoding scheme, each level is distinguishable by only 250 millivolts at the transmission end and less at the receiving end. This differential value would be halved for 8 level encoding. As such, providing multilevel encoding in integrated circuits is an ever-increasing challenge and currently is impractical to do for many applications.

Therefore, a need exists for a method and apparatus for effective multilevel encoding within integrated circuits.

BRIEF DESCRIPTION OF THE DRAWINGS

FIG. 5 illustrates a schematic block diagram of a further alternative multilevel signaling system in accordance with the present invention;

FIG. 6 illustrates yet another alternative embodiment of a multilevel signaling system in accordance with the present invention;

FIG. 7 illustrates a schematic block diagram of a multilevel signaling decoding system in accordance with the present invention;

FIG. 8 illustrates a schematic block diagram of an alternate multilevel signaling decoding system in accordance with the present invention;

DETAILED DISCUSSION OF A PREFERRED EMBODIMENT

Generally, the present invention provides a method and apparatus for multilevel signaling. Such a method and apparatus includes processing that begins by determining multilevel signaling operation conditions. Such multilevel signaling operation conditions include: determining the number of levels to be used for multilevel encoding, determining a desired bit rate for data transmission, determining characteristics of the transmission path that the data will traverse, determining power consumption constraints and/or determining error correction schemes for the data. The processing then continues by generating an adjust signal based on the determined multilevel signaling operation conditions. The adjust signal is used to change the magnitude of the multilevel signals produced via the multilevel encoding. The adjust signal may vary a supply voltage and/or vary gain of an amplifier stage. With such a method and apparatus, integrated circuits may utilize state of the art manufacturing techniques and operate from very low voltages, yet provide improved multilevel signaling performance by amplifying the multilevel signal data before transmission and/or upon reception.

Figure 1:
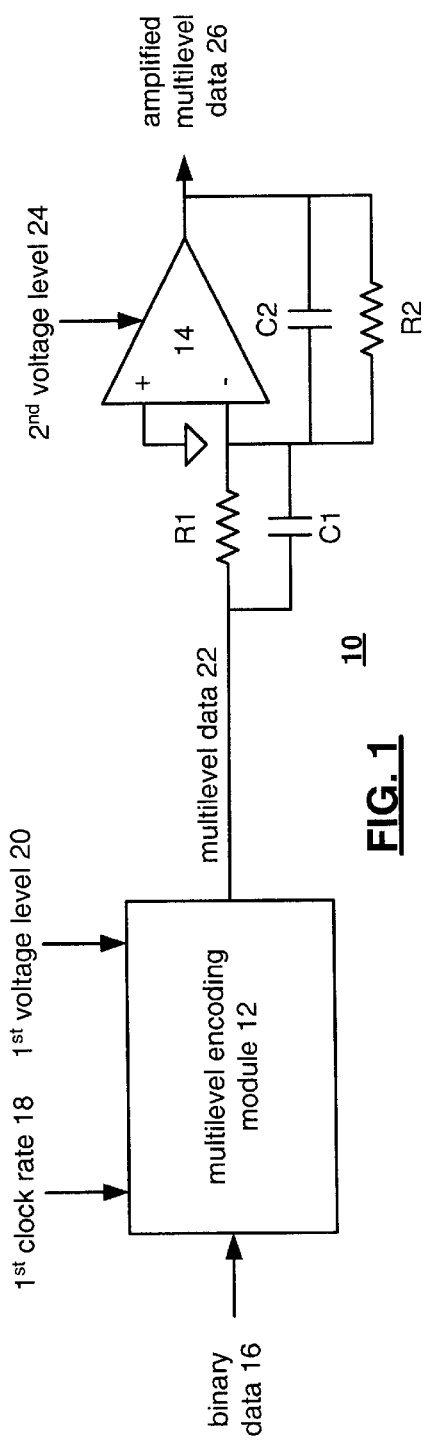
FIG. 1 illustrates a schematic block diagram of a multilevel signaling system in accordance with the present invention.

The present invention can be more fully described with reference to FIGS. 1 through 13. FIG. 1 illustrates a schematic block diagram of a multilevel encoding circuit 10 that includes a multilevel encoding module 12 and an amplifier 14. The multilevel encoding module 12 is operably coupled to receive binary data 16 at a $1^{st}$ clock rate 18. The multilevel encoding module 12 is powered at a 1st voltage level 20. In one embodiment, the multilevel encoding module 12 may perform the encoding function shown in FIG. 2 to produce multilevel data 22 from the binary data 16. Accordingly, as shown in FIG. 2, depending on the binary combination of two successive bits of the binary data, the multilevel data 22 is obtained.

Figure 2:
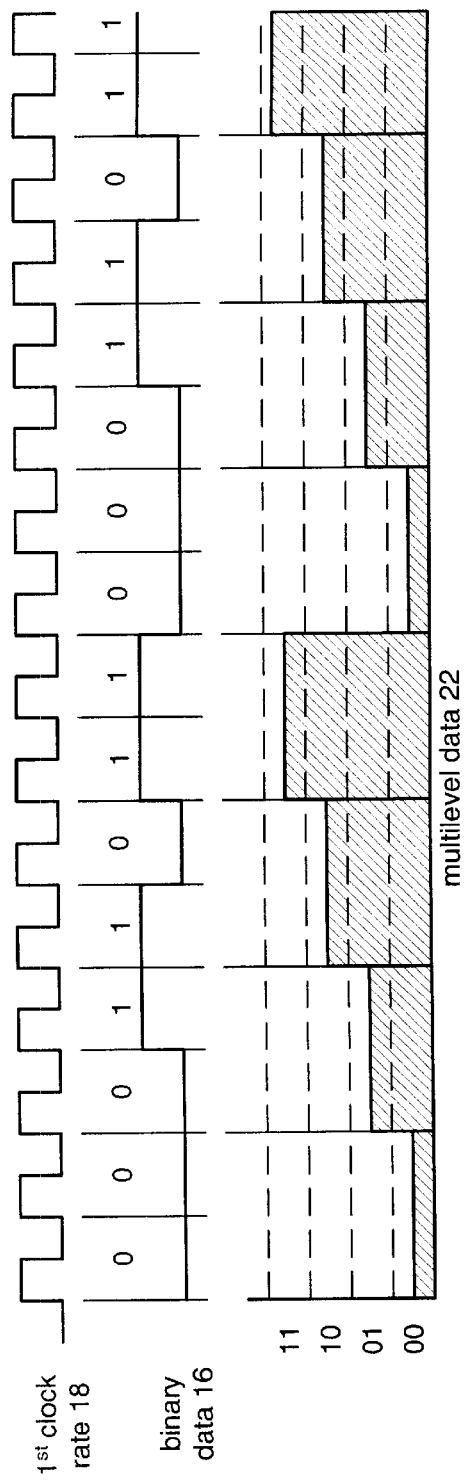
FIG. 2 illustrates a graphical representation of multilevel encoding in accordance with the present invention.

In particular, with reference to FIG. 2, the 1st two bits of binary data 16 are shown as 0 and 0. The multilevel encoding module 12 encodes these two bits into a voltage level that falls below the $1^{st}$ threshold. Accordingly, upon reception of the multilevel data 22 by a receiving entity, data below the 1st threshold corresponds to binary data 00. The next two bits of the binary data 16 are shown to be a 0 and 1. The multilevel encoding module 12 converts the 0 and 1 binary data into a voltage level that falls between the $1^{st}$ and $2^{nd}$ threshold. The next two bits of binary data 16 are a 1 and a 0. The multilevel encoding module 12 converts these bits into a voltage level that falls between the $2^{nd}$ and $3^{rd}$ thresholds. The next two bits of the binary data are 11. The multilevel encoding module 12 converts these bits into a voltage level that falls between a $3^{rd}$ and $4^{th}$ threshold.

Referring back to FIG. 1, the circuitry used to construct the multilevel encoding module 12 may be of known implementations. For example, the circuitry may include a pair of integrators, an amplifier with a tuned resistor-capacitor circuit and a comparator, a digital to analog converter, and/or any other known method for producing multilevel data from binary inputs. In addition, the circuitry of the multilevel encoding module 12 may be fabricated utilizing the latest integrated circuit manufacturing techniques. As such, the 1st voltage level 20 would correspond to the voltage level needed to power such advanced integrated circuits. For example, the $1^{st}$ voltage level 20 may be in the range of approximately 1 volt for a 0.10 micron integrated circuit. With the $1^{st}$ voltage level 20 being 1 volt, the $1^{st}$ threshold, as shown in FIG. 2 would be approximately 250 millivolts, the $2^{nd}$ threshold would be 500 millivolts, and the $3^{rd}$ threshold would be 750 millivolts. As one of average skill in the art will appreciate, the actual value for these thresholds may deviate from these values depending on the circuitry used to implement the multilevel encoding module 12, may be nonlinearly distributed, and/or centered approximately around 500 millivolts depending on the step level between each encoding of bit pairs.

With reference to FIG. 1, the amplifier 14 includes a pair of resistors R1 and R2 and a pair of capacitors C1 and C2. The resistors R1 and R2 are selected to provide a desired gain for the amplifier. Similarly, and in the same ratio as R1 and R2, capacitors C2 and C1 are selected to provide gain for amplifier 14. For example, the resistor-capacitor combination R1, R2, C1 and C2 may be selected such that the amplifier 14 has a gain of 2 over a desired frequency range. As such, the 1-volt output from the multilevel encoding module 12 would be converted to a 2-volt output producing the amplified multilevel data 26. Accordingly, the $2^{nd}$ voltage level 24 must exceed the $1^{st}$ voltage level 20 and be of sufficient value to provide the desired voltage level for the amplified multilevel data 26. For example, the $2^{nd}$ voltage level 24 may be 1½ volts up to 5 volts, for a $1^{st}$ voltage level 20 of approximately 1 volt. As one of average skill in the art will appreciate, the ratio between the $1^{st}$ and $2^{nd}$ voltage levels 20 and 24 are dependent on the desired amplification of the multilevel data, the power sources available within the integrated circuit, the transmission characteristics of the path over which the data will traverse, the accuracy of the recovery circuitry, etc.

The amplified multilevel data 26, which is the output of amplifier 14, has the same pattern as the multilevel data 22 as shown in FIG. 2 but the magnitudes for each encoded representation of bit pairs is amplified. As such, the amplified multilevel data 26 may be transmitted over greater distances, enable the multilevel encoding module to use more levels of encoding, and/or run at higher bit rates than if the amplifier 14 were omitted or was set for unity gain.

As an alternate implementation, the multilevel encoding module 12 could include a level shifting module operably coupled to the $2^{nd}$ voltage level 24. The level shifting module causes the multilevel data 22 to be at the second voltage level. As such, the amplifier 14 is configured as a unity gain amplifier, or buffer. The level shifting module may include an amplifier operably coupled to have a desired gain or as a current-mode amplifier. Such a current-mode amplifier includes a pair of variable resistors operably coupled in series with input transistors. The nodes coupling the input transistors to the variable resistors provide the output of the current-mode amplifier, where the gates of the input transistors provide the input for the current mode amplifier. The sources of the input transistors are operably coupled to a current regulation transistor whose gate is operably coupled to a current biasing circuit. The gain of the current regulation transistor may be variable, such that the output voltage is based on the gain of the current regulation transistor, the biasing current, and the resistance of the output variable resistors.

Figure 3:
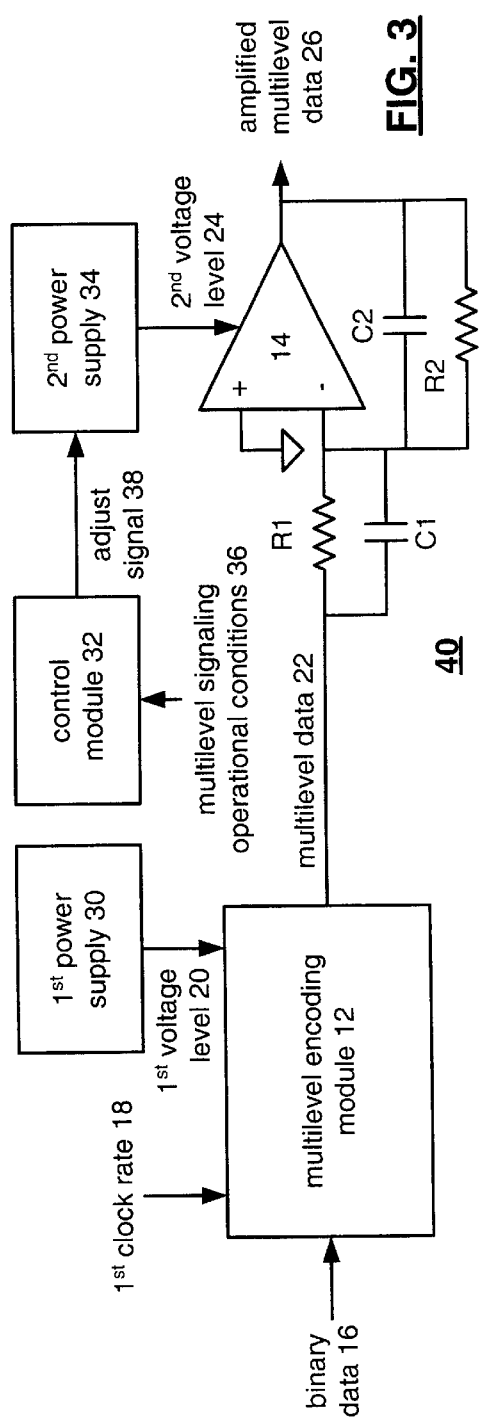
FIG. 3 illustrates a schematic block diagram of an alternate multilevel signaling system in accordance with the present invention.

FIG. 3 illustrates a schematic block diagram of the encoding system 10 to further include a $1^{st}$ power supply 30, a control module 32 and a $2^{nd}$ power supply 34. The $1^{st}$ power supply 30 provides the $1^{st}$ voltage level 20 and the $2^{nd}$ power supply 34 provides the $2^{nd}$ voltage level 24. The $1^{st}$ and $2^{nd}$ power supplies 30 and 34 may be linear regulators, on-chip switch-mode power supplies, external switch-mode power supplies, batteries, and/or any source that provides a regulated voltage.

Figure 4:
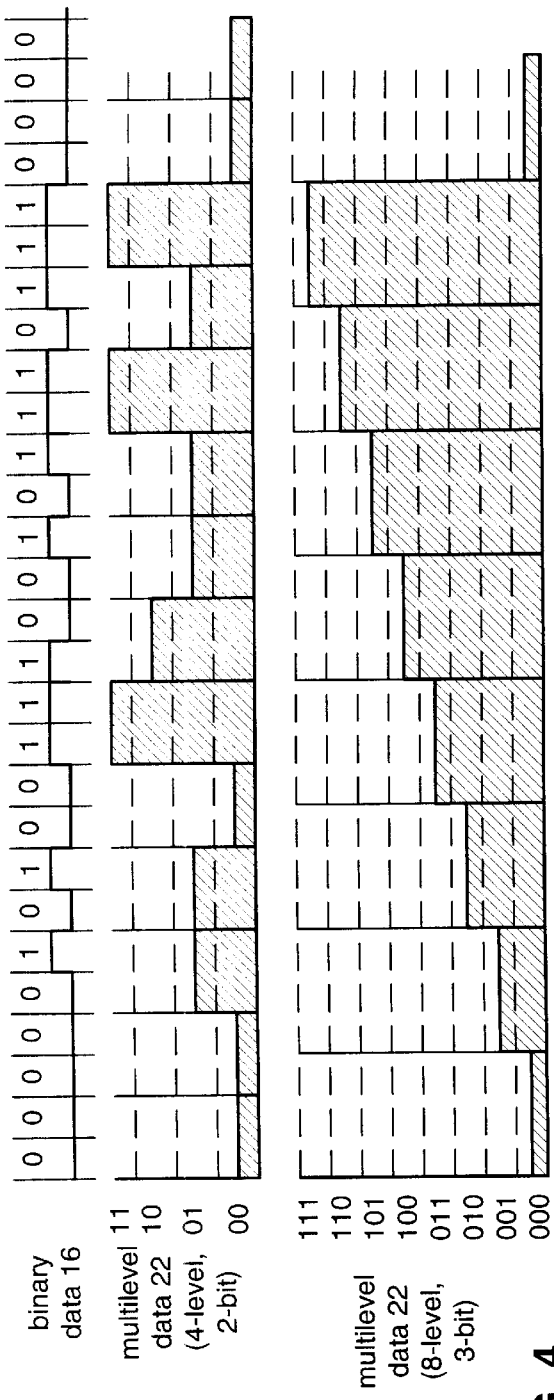
FIG. 4 illustrates a graphical representation of various multilevel encoding schemes in accordance with the present invention.

The control module 32 is operably coupled to receive multilevel signaling operation conditions 36 and produce therefrom an adjust signal 38. The multilevel signaling operational conditions 36 include, but are not limited to, one or more of: determining the number of levels of the multilevel signaling operation (e.g., 4-levels, 8-levels, 16-levels, et cetera), determining the bit rate of the data, determining the characteristics of the transmission path that the data will traverse, determining power consumption constraints, and/or determining error correction at the receiving end. As one of average skill in the art will appreciate, the amplitude for the amplified multilevel data 26 may be regulated based on the multilevel signaling operation conditions 36, wherein the analog reference is dependent on the second voltage level 24. For example, if 4-level, 2-bit multilevel encoding is used, as shown in FIG. 4, the $2^{nd}$ voltage level 24 does not need to be as large as it would be if the encoding were 8-level, 3-bit encoding as also shown in FIG. 4. In addition, the higher the encoding level, the more desirable it would be to operate at a higher voltage such that the levels are more readily distinguishable.

The characteristics of the transmission line will greatly affect the level provided by amplifier 14. The more adverse the characteristics are to the amplified multilevel data 26, the larger the $2^{nd}$ voltage level 24 should be. However, the determination for the adjust signal 38 may be restricted by the power consumption constraints for the integrated circuit. As such, trade-offs in performance, speed of the transistors in the circuits, and power consumption may be made in setting the adjust signal 38 to produce the $2^{nd}$ voltage level 24.

FIG. 5 illustrates a schematic block diagram of an alternate multilevel encoding system 50 that includes the multilevel encoding module 12, the amplifier 14, the $1^{st}$ power supply 30, the control module 32, and the $2^{nd}$ power supply 34. In this embodiment, the control module 32 provides the adjust signal 38 to variable capacitor C2 and/or variable resistor R2. In this implementation, the $2^{nd}$ voltage level 24 is a fixed voltage level. Accordingly, the amplified multilevel data 26 is based on the ratio of C1 to C2 and R2 to R1, which is set based on the adjust signal 38.

The control module 32, based on the multilevel signaling operational conditions 36 produces the adjust signal 38 as previously described. The functioning of the control module 32 will be described in greater detail with references to FIGS. 10, 11, and/or 12.

FIG. 6 illustrates a schematic block diagram of yet another multilevel encoding system 60 that includes multilevel encoding module 12, amplifier 14, resistors R1, R2, capacitors C1, C2, the $1^{st}$ power supply 30, the control module 32 and the $2^{nd}$ power supply 34. In this embodiment, the control module 32, based on operational parameters 62, generates an adjust signal 38 and a level signal 64. The adjust signal 38 may control variable resistor R2 and variable capacitor C2 and/or control the $2^d$ power supply 34 to produce a variable $2^d$ voltage level 24. As one of average skill in the art will appreciate, the variable resistor-capacitor combination may be R1 and C1 instead of R2 and C2, or all four components may be variable based on the adjust signal.

The operational parameters 62 include one or more of, but are not limited to, determining receiver detection capabilities (i.e., what level of encoding can the receiver handle), determining available supply levels for the $2^{nd}$ voltage level 24, determining the bit-rate of the multilevel data, determining the characteristics of the transmission path the data will traverse, determining power consumption constraints, and/or determining error correction capabilities. The error correction capabilities include CRC verification, forward error correction, bit interpretation, and/or any other known technique for correcting multilevel data transmission errors. Based on these parameters 62, the control module 32 determines the particular level of encoding to be performed by multilevel encoding module 12. Accordingly, the control module 32 generates the level signal 64, which programs the multilevel encoding module 12 to perform the desired multilevel encoding. The multilevel encoding may be 4-levels, 8-levels, 16-levels, et cetera.

FIG. 7 illustrates a schematic block diagram of a multilevel decoding system 70 in accordance with the present invention. The multilevel decoding system 70 includes an amplifier 72 and a multilevel decoding module 74. The amplifier 72 includes associated circuitry R1, R2, C1, and C2 that attenuates (with a less than, or equal, to one) the incoming multilevel encoded data 76. The amplifier 72 is powered at a $2^{nd}$ voltage level 24. The multilevel decoding module 74 receives the attenuated multilevel data 78 and, based on the $1^{st}$ clock rate 18, produces binary data 16. The binary data 16 is produced by circuitry that is operated at the $1^{st}$ voltage level 20. The operation performed by the multilevel decoding module 74 is the inverse of the encoding function as shown in FIGS. 2 and 4. Accordingly, as shown in FIGS. 2 or 4, the amplified multilevel data 78 will correspond to a particular voltage level. Based on a number of intervals of the $1^{st}$ clock rate, the multilevel decoding module 74 will recapture bit values to produce the binary data 16.

FIG. 8 illustrates a schematic block diagram of an alternate embodiment of a multilevel decoding system 80. The multilevel decoding system 80 includes the amplifier 72, the multilevel decoding module 74, the $2^d$ power supply 34, the $1^{st}$ power supply 30 and the control module 32. The control module 32 generates an adjust signal 39 and/or a level signal 65. The control module 32 determines the adjust signal 39 based on multilevel signaling operation conditions 36 and determines the level of encoding 65 based on operational parameters 62. Accordingly, the multilevel decoding system 80 may be programmed to decode various levels of encoded multilevel data based on the operational conditions of the system in which the decoder is included.

Figure 9:
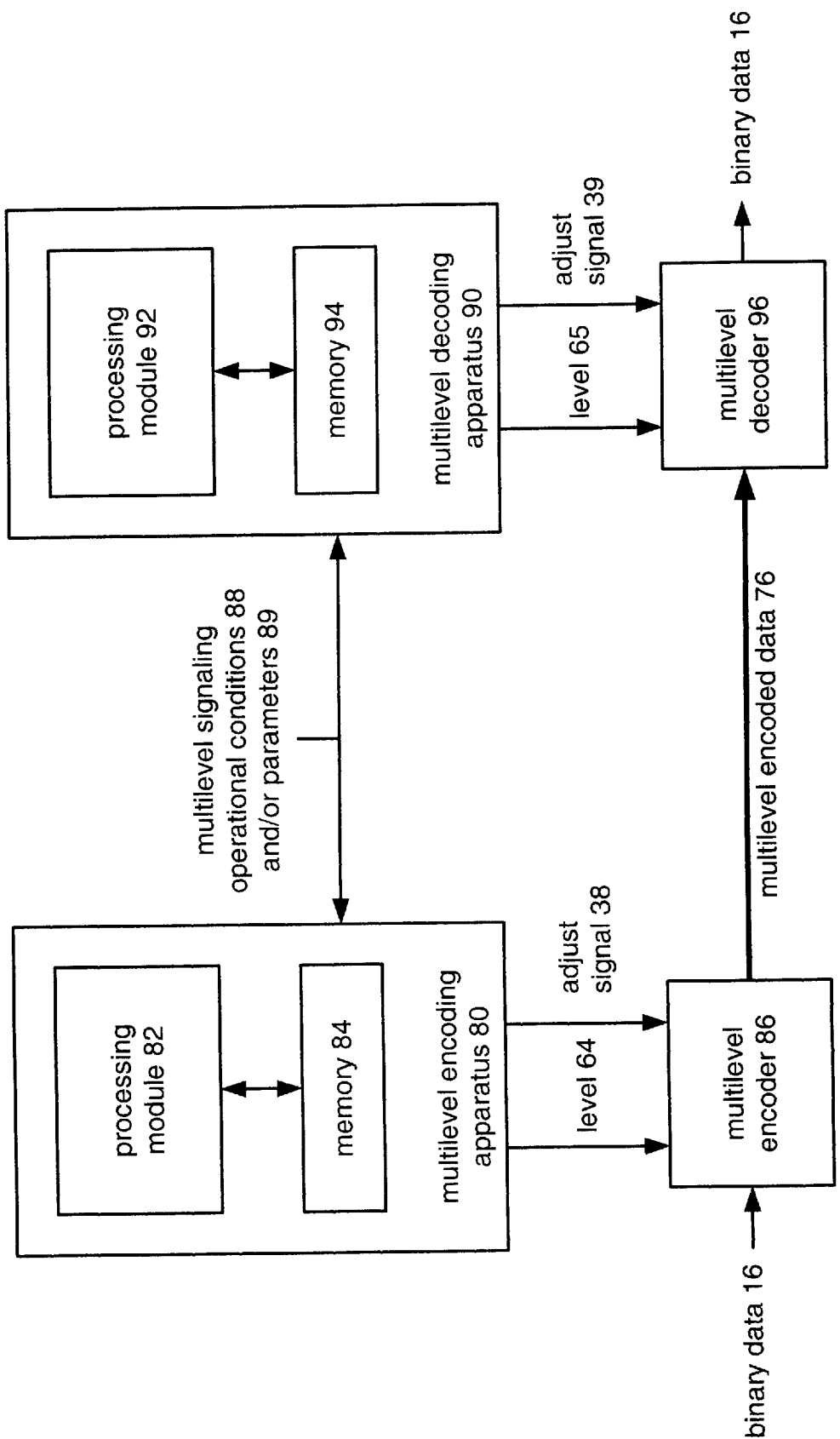
FIG. 9 illustrates a schematic block diagram of a still further multilevel signaling system in accordance with the present invention.

FIG. 9 illustrates a schematic block diagram of a multilevel encoding apparatus 80 operably coupled to a multilevel encoder 86, and a multilevel decoding apparatus 90 operably coupled to a multilevel decoder 96. The multilevel encoder 86 may include the circuitry as shown in FIG. 1, in particular, the multilevel encoding module 12 and the adjustable amplifier 14. The multilevel decoder 96 may include the circuitry as shown in FIG. 7 and in particular includes an adjustable amplifier 72 and a multilevel decoding module 74.

The multilevel encoding apparatus 80 includes a processing module 82 and memory 84. The processing module 82 may be a single processing device or a plurality of processing devices. Such a processing device may be a microprocessor, microcontroller, microcomputer, digital signal processor, state machine, logic circuitry, field programmable gate array, and/or any device that manipulates signals (analog or digital) based on operational instructions. The memory 84 may be a single memory device or a plurality of memory devices. Such a memory device may be a read-only memory, random access memory, flash memory, magnetic tape memory, and/or any device for storing digital information. Note that when the processing module 82 implements one or more of its functions via a state machine or logic circuitry, the memory storing the corresponding operational instructions is embedded within the circuitry comprising the state machine and/or logic circuit. The operational instructions stored in memory 84 and executed by processing module 82 are generally illustrated in the logic diagrams of FIGS. 10 through 13.

In general, the multilevel encoding apparatus 80 receives multilevel signaling operational conditions 88 and/or operational parameters 89. Based on these inputs, the multilevel encoding apparatus 80 generates an adjust signal 38 and/or a level signal 64. The adjust signal 38 and/or the level signal 64 are provided to the multilevel encoder 86, which is operably coupled to convert binary data 16 into a multilevel encoded data 76 based on these inputs.

The multilevel decoding apparatus 90 includes a processing module 92 and memory 94. The processing module 92 may be a single processing device or a plurality of processing devices. Such a processing device may be a microprocessor, microcontroller, microcomputer, digital signal processor, state machine, logic circuitry, field programmable gate array, and/or any device that manipulates signals (analog or digital) based on operational instructions. The memory 94 may be a single memory device or a plurality of memory devices. Such a memory device may be a read-only memory, random access memory, flash memory, magnetic tape memory, and/or any device for storing digital information. Note that when the processing module 92 implements one or more of its functions via a state machine or logic circuitry, the memory storing the corresponding operational instructions is embedded within the circuitry comprising the state machine and/or logic circuit. The operational instructions stored in memory 94 and executed by processing module 92 are generally illustrated in the logic diagrams of FIGS. 10 through 13.

In general, the multilevel decoding apparatus 90 receives the multilevel signaling operational conditions 88 and/or the operational parameters 89 and generates the adjust signal 39 and/or the level signal 65. The multilevel decoder 96 receives the multilevel encoded data 76, and based on the adjust signal 39 and/or the level signal 65, recaptures binary data 16.

Figure 10:
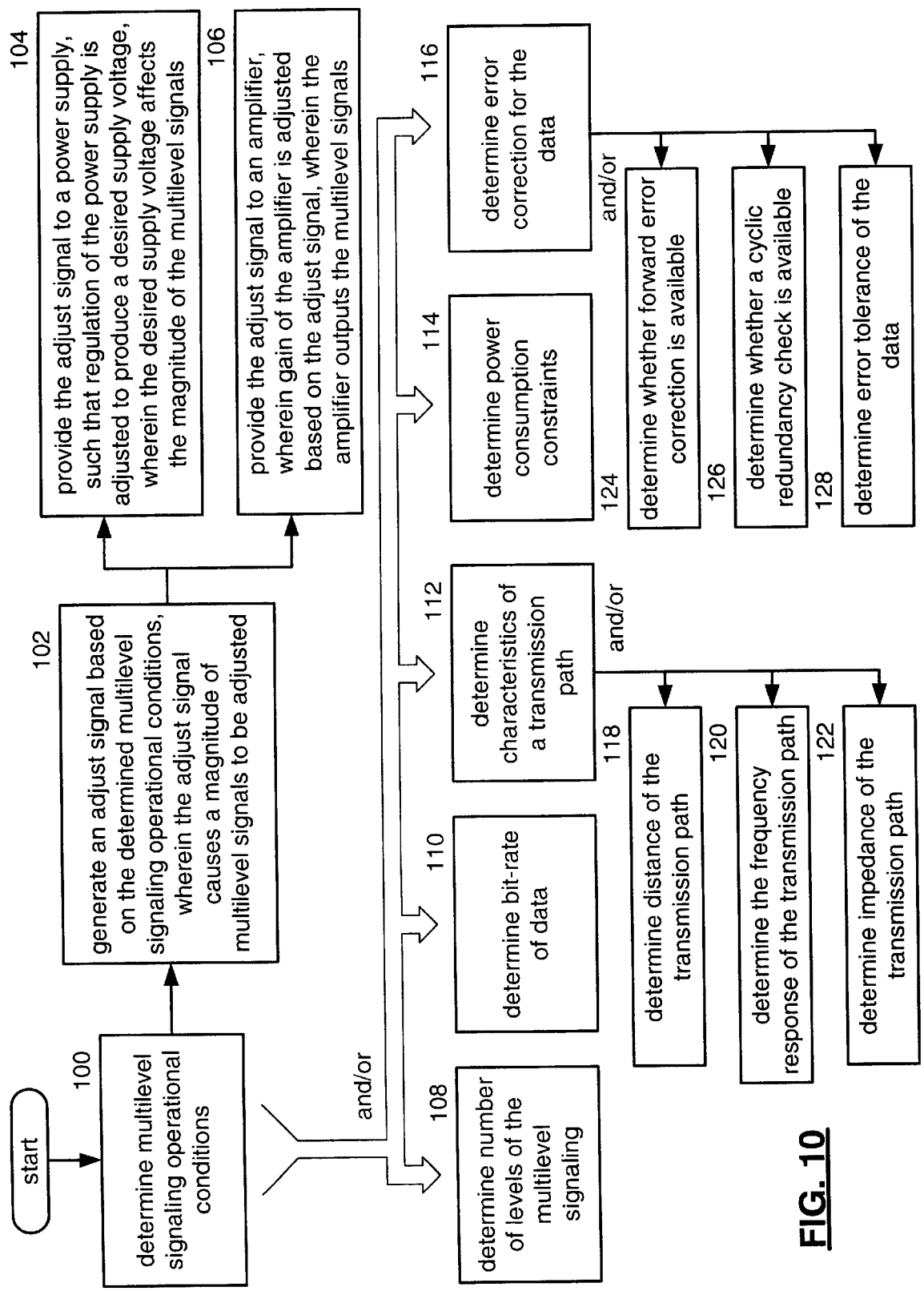
FIG. 10 illustrates a logic diagram of a method for multilevel signaling in accordance with the present invention.

FIG. 10 illustrates a logic diagram of a method for multilevel encoding of data. The process begins at Step 100 where multilevel signaling operational conditions are determined. The process then proceeds to Step 102 where an adjust signal is generated based on the determined multilevel signaling operational conditions. The adjust signal causes the magnitude of the multilevel encoded data, or signals, to be adjusted. As such, by increasing the magnitude of the signals, the multilevel encoded data may be transmitted at greater distances, transmitted at higher rates, and/or utilize greater levels of encoding. In addition, most of the circuitry incorporated on an integrated circuit may utilize the latest manufacturing techniques and thus be powered off of relatively low voltages without degradation to the level of differentiation between multilevel encoded data.

The process then proceeds to Step 104 or 106. At Step 104, the adjust signal is provided to a power supply. The adjust signal regulates the power supply to produce a desired supply voltage. The desired supply voltage affects the magnitude of the multilevel signal. Accordingly, the adjust signal regulates the power supply to cause the multilevel encoded data to have a desired magnitude range.

At Step 106, the adjust signal is provided to an amplifier. The adjust signal affects the gain of the amplifier such that the magnitude of the multilevel signal is adjusted. This was illustrated with reference to FIGS. 1 through 6.

The multilevel signaling operational conditions of Step 100 may be determined in a variety of ways. As shown, the multilevel signaling operational conditions may be determined as shown in Steps 108, 110, 112, 114 and/or 116. At Step 108, the number of levels of multilevel signaling is determined. In other words, a determination is made as to whether 4-level signaling, 8-level signaling, et cetera will be utilized for the multilevel encoding. At Step 110, a determination is made as to the bit-rate for the data. Based on the bit-rate of the data, the magnitude of the signals may be adjusted. For example, at lower bit-rates, the characteristics of the transmission path have a lesser effect on the signal integrity of the transmitted data (i.e., introduce less distortion). Thus, the distortion of the encoded signals is reduced, therefore the magnitude of the encoded signals does not need to be as great as if the bit-rate is higher.

At Step 112, the characteristics of the transmission path are determined. This may be done as shown in Steps 118, 120 and/or 122. At Step 118, a distance of the transmission path is determined. As is known, the distance affects the impedance and frequency characteristics of the transmission path. At Step 120, the actual frequency response of the transmission path is determined. At Step 122, the impedance of the transmission path is determined. Based on one or more of these characteristics, the multilevel encoding may be effected. As one of average skill in the art will appreciate, if the frequency response greatly affects the signaling, the magnitude of the signal needs to be as large as possible to reduce the adverse affects of the transmission path. Also, forward error correction and/or equalization may be used to help reduce the adverse effects of the transmission path.

At Step 114, the power consumption constraints are determined. If, the device is used in a portable device, where power consumption is of great concern, the performance of the multilevel encoding may be traded-off to meet the power consumption constraints.

At Step 116, error correction is determined for the multilevel encoded data. This may be done as shown at Step 124, 126 and/or at Step 128. At Step 124, a determination is made as to whether forward error correction is available within the multilevel encoder and/or within the multilevel decoder. If so, the voltage level for the multilevel encoding may be less than if error correction is not available or if less sophisticated error correction is available. At Step 126, a determination is made as to whether cyclic redundancy checking is available to verify the integrity of the transmission. If not, the magnitude may be greater to ensure that the data is more accurately recaptured.

At Step 128, a further determination may be made to determine the error tolerance of the data. In some applications, a certain level of error may be tolerated, as such, voltage levels of the multilevel signaling may be reduced. If errors are intolerable for the system, the voltage levels of the encoded multilevel data need to be of sufficient values to minimize errors.

Figure 11:
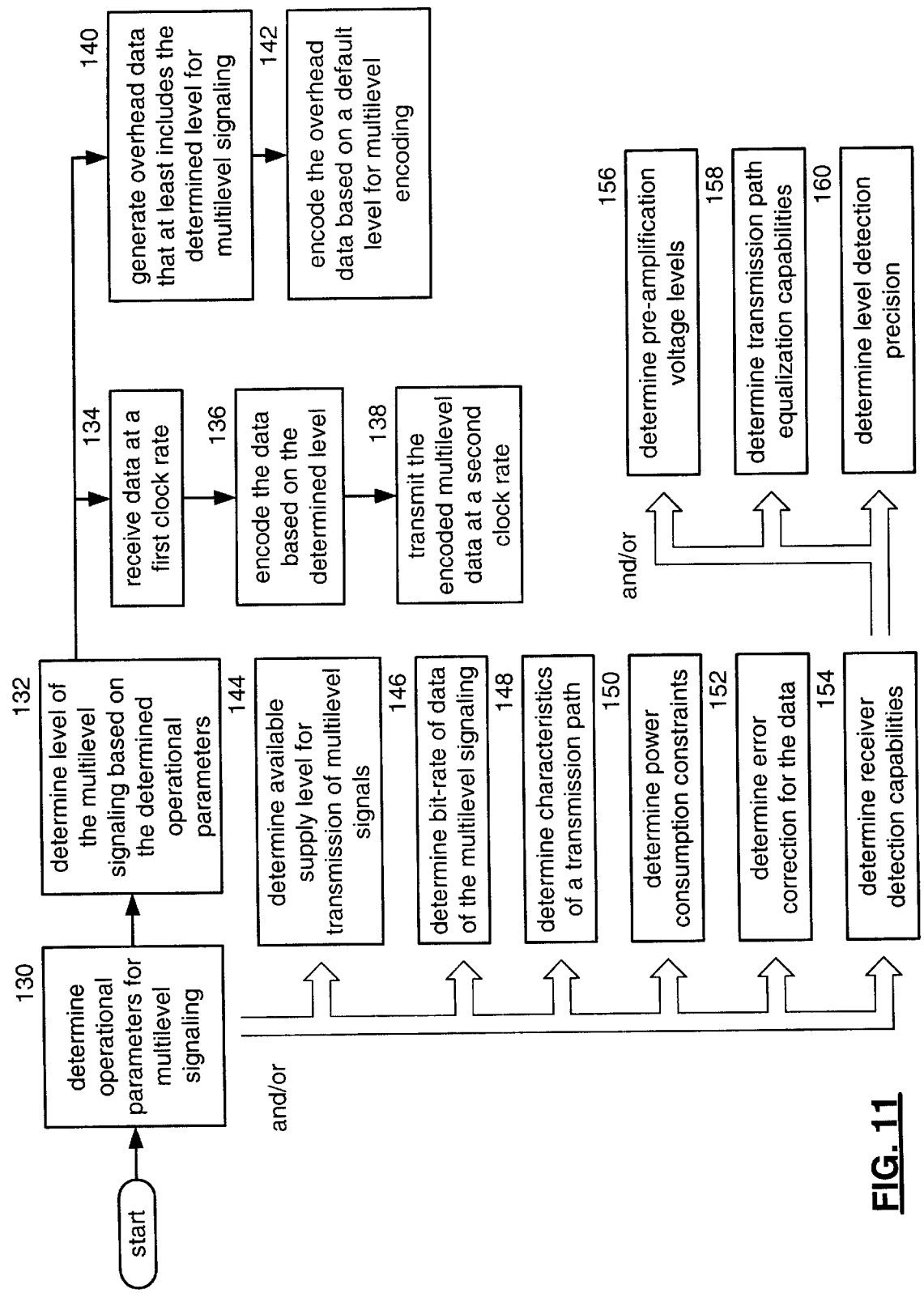
FIG. 11 illustrates a logic diagram of an alternate method for multilevel signaling in accordance with the present invention.

FIG. 11 illustrates a logic diagram of a method for multilevel encoding of data in accordance with the present invention. The process begins at Step 130 where operational parameters for multilevel signaling are determined,. This will be further discussed with reference to Steps 144 through 160. The process then proceeds to Step 132 where the level of multilevel signaling is determined based on the operational parameters. The process then proceeds to Steps 134 through 138 and to Steps 140 through 142. At Step 134, data is received at a $1^{st}$ clock rate. The process then proceeds to Step 136 where the data is encoded based on the determined level. For example, if the level were determined to be 4, the encoding would be 2-bit encoding. The process then proceeds to Step 138 where the encoded multilevel data is transmitted at a $2^{nd}$ clock rate. Continuing with the previous example, if 2-bit encoding is utilized, the $2^{nd}$ clock rate would be half that of the $1^{st}$ clock rate.

At Step 140, overhead data may be generated that includes an indication as to the level for multilevel signaling.

The process then proceeds to Step 142 where the overhead data is encoded based on a default level for multilevel encoding. For example, the default level of encoding may be 2-bit 4-level encoding. Based on the operational conditions for the circuitry embodying the encoder and multilevel decoder of the present invention, it may be determined that the level for multilevel signaling may be 3-bit 8-level. As such, the 3-bit 8-level encoding is included in overhead data but is transmitted utilizing the 2-bit 4-level default encoding scheme.

The determination of the operational parameters for multilevel signaling is disclosed in Steps 144 through 154. The operational parameters may include one or more of these elements. At Step 144, a determination is made as to the available supply level for transmission of multilevel signals. For example, if only a 1½ volt source is available, it may be desirable to limit the multilevel signaling to 4-level or 8-level as opposed to 16-level. If, on the other hand, a 5 volt supply is available, 16-level encoding may be the encoding level of choice.

At Step 146, a determination is made as to the bit-rate of the multilevel signaling data. At Step 148, a determination is made as to the characteristics of the transmission path. At Step 150, a determination is made as to power consumption constraints. At Step 152, a determination is made as to available error correction for the transmitted and received encoded data. At Step 154, receiver detection capabilities are determined. The receiver detection capabilities include one or more of the functions illustrated in Steps 156 through 160.

At Step 156, a determination is made as to whether the receiver includes pre-amplification voltage levels. For example, a determination is made as to whether the data is going to be pre-amplified stepped up to or down to 1 volt, 3 volts, 5 volts et cetera. At Step 158, a determination is made as to the transmission path equalization capabilities of the receiver. If the receiver includes an equalizer to compensate for the frequency characteristics of the transmission path, the level of signaling may be increased and/or the voltage level may be decreased.

At Step 160, a determination is made as to the level detection precision, speed, and/or bandwidth of the receiver. Such a determination is based on the complexity of the circuitry within the receiver. If the receiver includes a simple 2-bit analog to digital converter, the multilevel encoding can only be 2 bits. If, however, the receiver includes a 4-bit analog to digital converter, the multilevel encoding may be 16 levels and/or 4 bits.

Figure 12:
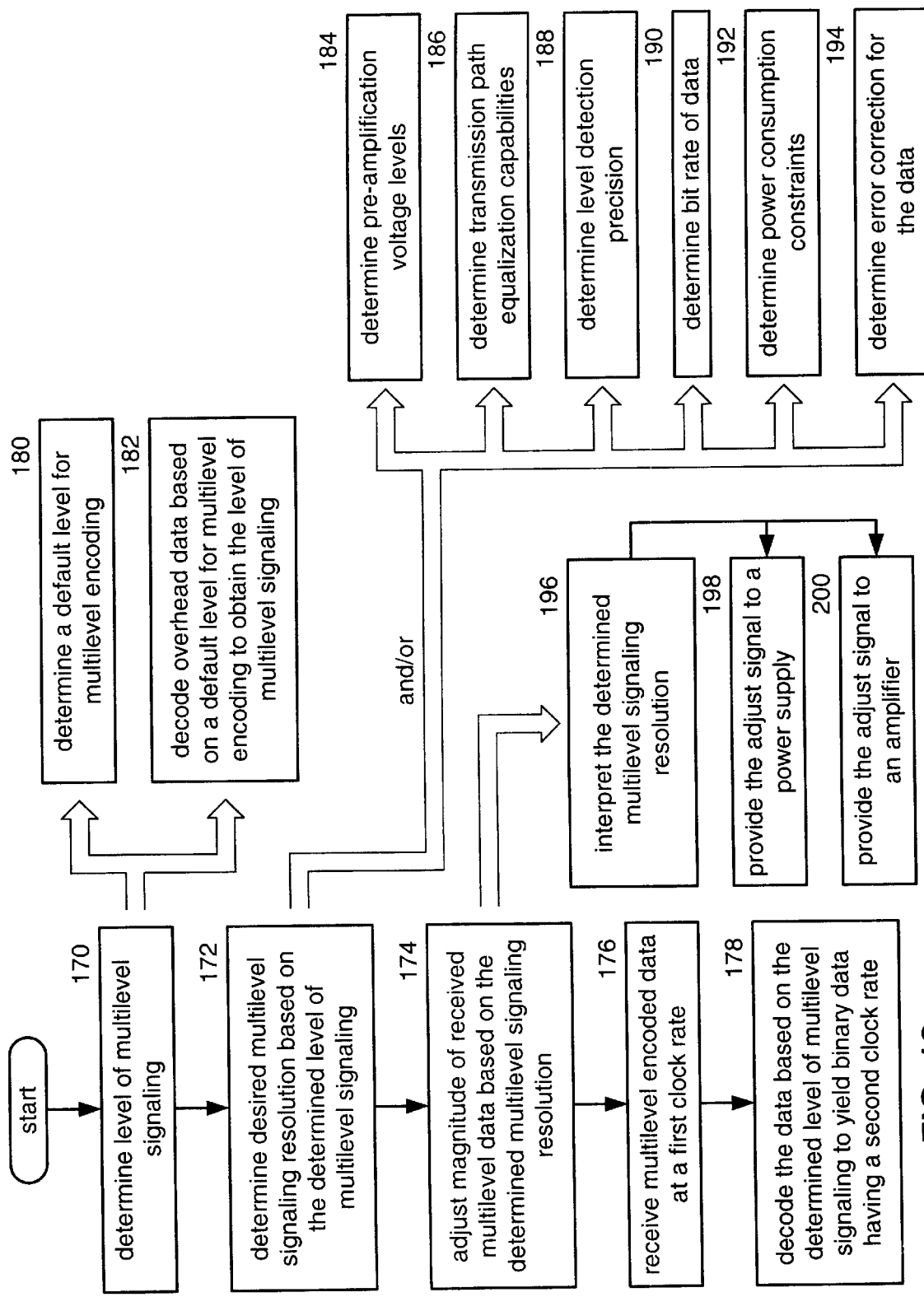
FIG. 12 illustrates a logic diagram of yet another method for multilevel signaling in accordance with the present invention.

FIG. 12 illustrates a logic diagram of a method for multilevel decoding. The process begins at Step 170 where a determination is made as to the level of multilevel sampling. This will be discussed in greater detail with reference to Steps 180 and 182. The process then proceeds to Step 172 where a determination is made as to the desired multilevel signaling resolution, which is based on the determined level of multilevel sampling. This will be discussed in greater detail with reference to Steps 184 through 194.

The process then proceeds to Step 174 where the magnitude of received multilevel data is adjusted based on the determined multilevel signaling resolution. This will be discussed in greater detail with reference to Steps 196 through 200. The process then proceeds to Step 176 where the multilevel encoded data is received at a $1^{st}$ clock rate. The process then proceeds to Step 178 where the data is decoded based on the determined level of multilevel signaling to yield binary data at a $2^{nd}$ clock rate. In this example, the $2^{nd}$ clock rate corresponds to the binary data rate and the $1^{st}$ clock rate corresponds to the multilevel encoded data rate. Note that this convention of the first and second clock rate is converse to what was illustrated with reference to FIGS. 1 through 9.

The determination of the level of multilevel signaling is further shown with reference to Steps 180 and 182. At Step 180, a determination is made as to a default level for multilevel encoding. As such, all multilevel encoding may be based on a default value, e.g., four level encoding. Alternatively, the multilevel decoding may be done as shown in Step 182 where overhead data is decoded based on a default level for multilevel encoding to obtain the actual level of multilevel encoding.

The determination of the desired multilevel signaling resolution of Step 172 is further described with reference to Steps 184 through 194. At Step 184, a determination is made as to the pre-amplification voltage levels available for the decoder. Such pre-amplification voltages are dependent on the system in which the decoder is embedded. Such available voltages may be 1 volt, 1½ volts, 2 volts, 3 volts, et cetera. At Step 186, a determination is made as to the transmission path equalization capabilities of the receiver. If the receiver includes equalization capabilities, its resolution for detecting the levels of encoding is greater, thus, the level of encoding may be increased.

At Step 188, a determination is made as to the level detection precision. The level detection precision may correspond to whether a 2-bit A-D converter, 4-bit A-D converter, 16-bit A-D converter, et cetera is used. At Step 190 a determination is made as to the bit-rate of the incoming encoded data and the desired output data. At Step 192, a determination is made as to the power consumption constraints of the circuitry including the decoder. At Step 194, a determination is made as to the error correction for the data included in the receiver.

Figure 13:
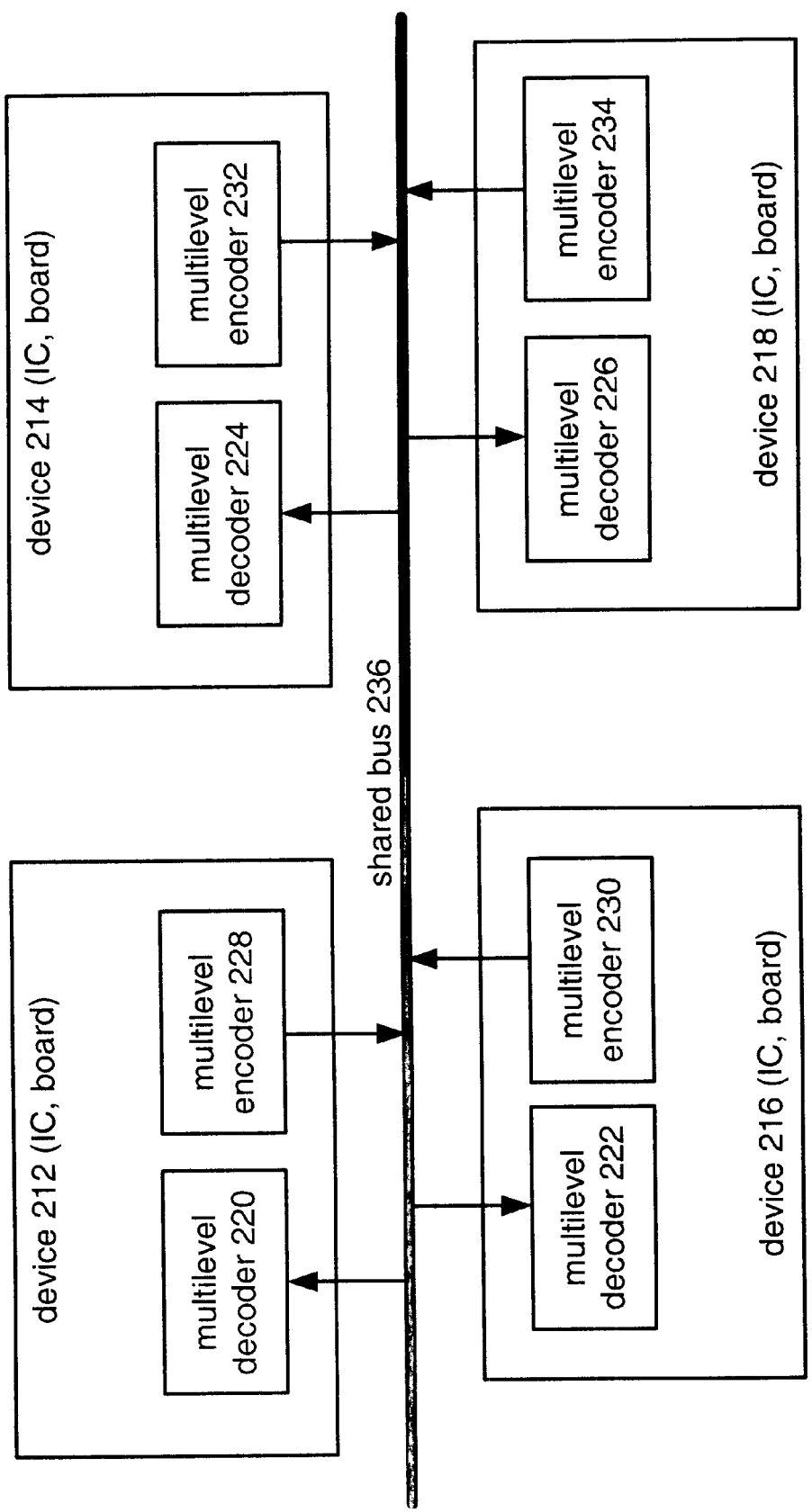
FIG. 13 illustrates a schematic block diagram of a system including devices utilizing multilevel signaling in accordance with the present invention.

FIG. 13 illustrates a schematic block diagram of a system 210 that includes a plurality of devices 212 through 218. Each of the devices 212 through 218 may be integrated circuits mounted on a printed circuit board and/or printed circuit boards in a system. Each of the devices includes a multilevel decoder 220 through 226 and a multilevel encoder 228 through 234. The multilevel decoders 220 through 226 may include circuitry as shown in FIGS. 7 through 9 and perform the functions described with reference to FIG. 12 while the multilevel encoders may include circuitry as shown in FIGS. 1 through 6 and 9 and perform the functions described with reference to FIGS. 10 and 11.

Each of the devices 212 through 218 is coupled to a shared bus 236. In this illustration, the multilevel encoders 228 through 234 for any of the devices may transmit encoded data on the shared bus 236. The encoded data may include an address, which identifies a particular targeted device for the encoded data. The multilevel decoder for the targeted device identifies the encoded data and correspondingly decodes the data to recapture the original binary data. As one of average skill in the art will appreciate, devices 212 through 218 may be microprocessors, microcontrollers, field programmable gate arrays, an application specific integrated circuit, and/or any integrated circuit that transceives data via a serial transmission path. As one of average skill in the art will further appreciate, each device may include a plurality of multilevel encoders and decoders that operate individually or in parallel to transmit data within the system. Such a system may provide Ethernet access, time division multiplex access, etc. to other systems, such as the Internet, WANs, and/or LANs.

The preceding discussion has presented a method and apparatus for multilevel encoding and decoding of data. By varying the magnitude of the multilevel encoded data, various levels of encoding may be used, as well as varying bit-rates and transmission links may be utilized. In addition, by including the programmable voltage level for the multilevel signaling, the latest integrated circuit manufacturing techniques may be used for a majority of circuitry within such integrated circuits to operate from low voltage supplies such as a 1-volt supply. As one of average skill in the art will appreciate, other embodiments may be derived from the teachings of the present invention without deviating from the scope of the claims. For example, the amplified multilevel data 26 may be differential signals, such that the circuitry (multilevel encoder/decoder and/or amplifier) is differential circuits.

What is claimed is:

1. A method of multilevel signaling, the method comprises:

determining an adjust signal for amplifying a multilevel signal from a first voltage level to a second voltage level;

determining operational parameters for multilevel signaling to produce determined operational parameters; and determining level of the multilevel signaling based on the determined operational parameters and the adjust signal.

2. The method of claim 1, wherein the determining the operational parameters further comprises at least one of:

determining receiver detection capabilities;

determining available supply level for transmission of multilevel signals;

determining bit-rate of data of the multilevel signaling;

determining characteristics of a transmission path the data will traverse;

determining power consumption constraints; and determining error correction for the data.

3. The method of claim 2, wherein the determining the receiver detection capabilities further comprises at least one of:

determining pre-amplification voltage levels;

determining transmission path equalization capabilities; and determining level detection precision.

4. The method of claim 1 further comprises:

receiving data at a first clock rate;

encoding the data based on the determined level for the multilevel signaling to produce encoded multilevel data; and transmitting the encoded multilevel data at a second clock rate.

5. The method of claim 4, wherein the encoding further comprises:

generating overhead data that at least includes the determined level for multilevel signaling; and encoding the overhead data based on a default level for multilevel encoding.

6. A method for receiving multilevel signals, the method comprises:

determining level of multilevel signaling to produce determined level of multilevel signaling;

determining desired multilevel signaling resolution based on the determined level of multilevel signaling to produce determined multilevel resolution; and adjusting magnitude of received multilevel data based on the determined multilevel signaling resolution.

7. The method of claim 6, wherein the determining the desired multilevel signaling resolution further comprises at least one of:

determining pre-amplification voltage levels;

determining transmission path equalization capabilities;

determining level detection precision;

determining bit-rate of data;

determining power consumption constraints; and determining error correction for the data.

8. The method of claim 6, further comprises:

receiving multilevel encoded data at a first clock rate; and decoding the data based on the determined level of multilevel signaling to produce decoded binary data having a second clock rate.

9. The method of claim 8 further comprises:

decoding overhead data based on a default level for multilevel encoding to obtain the level of multilevel signaling.

10. The method of claim 6, wherein the determining the level of multilevel signaling further comprises:

determining a default level for multilevel encoding.

11. The method of claim 6, wherein the adjusting magnitude of the received multilevel data further comprises:

interpreting the determined multilevel signaling resolution to produce an adjust signal; and providing the adjust signal to a power supply, such that regulation of the power supply is adjusted to produce a desired supply voltage, wherein the desired supply voltage affects the magnitude of the received multilevel data.

12. The method of claim 6, wherein the adjusting magnitude of the received multilevel data further comprises:

interpreting the determined multilevel signaling resolution to produce an adjust signal; and providing the adjust signal to an amplifier, wherein the gain of the amplifier is adjusted based on the adjust signal, and wherein the amplifier outputs the received multilevel data.

13. A multilevel signaling system comprising:

multilevel encoding module operably coupled to receive binary data at a first clock rate and produce therefrom multilevel data wherein the multilevel encoding module is powered at a first voltage level;

amplifier operably coupled to amplify the multilevel data to produce amplified multilevel data, wherein the amplifier is powered at a second voltage level, and wherein the second voltage level is greater than the first voltage level;

first power supply operably coupled to provide the first voltage level, wherein the first voltage level is less than 1.80 volts; and second power supply operably coupled to provide the second voltage level.

14. The multilevel signaling system of claim 13 further comprises:

control module operably coupled to the second power supply, wherein the control module generates an adjust signal based on multilevel signaling operational conditions, and wherein the control module provides the adjust signal to the second power supply such that the second voltage level is adjusted.

15. A multilevel signaling system comprises:
amplifier operably coupled to amplify received multilevel encoded data producing amplified multilevel data, wherein the amplifier is powered at a second voltage level; and
multilevel decoding module operably coupled to decode the amplified multilevel data into binary data, wherein the multilevel decoding module is powered at a first voltage level, wherein the second voltage level is greater than the first voltage level.

16. The multilevel signaling system of claim 15 further comprises:
first power supply operably coupled to provide the first voltage level, wherein the first voltage level is less than 1.8 volts; and
second power supply operably coupled to provide the second voltage level.

17. The multilevel signaling system of claim 16 further comprises:
control module operably coupled to the second power supply, wherein the control module generates an adjust signal based on multilevel signaling operational conditions, and wherein the control module provides the adjust signal to the second power supply such that the second voltage level is adjusted.

18. The multilevel signaling system of claim 15 further comprises:
control module operably coupled to the amplifier, wherein the control module generates an adjust signal based on multilevel signaling operational conditions, and wherein the control module provides the adjust signal to the amplifier such that magnitude of the amplified multilevel data is adjusted.

19. The multilevel signaling system of claim 15 further comprises:
control module operably coupled to the multilevel decoding module, wherein the control module determines operational parameters for multilevel signaling to produce determined operational parameters and level of the multilevel signaling based on the determined operational parameters, and wherein the multilevel decoding module generates the binary data from the amplified multilevel data based on the level of the multilevel signaling.

20. An apparatus for multilevel signal operation, the apparatus comprising:
processing module; and
memory operably coupled to the processing module, wherein the memory stores operational instructions that cause the processing module to:
determine multilevel signaling operational conditions to produce determined multilevel signaling operational conditions; and
generate an adjust signal based on the determined multilevel signaling operational conditions, wherein the adjust signal causes a magnitude of multilevel signals to be adjusted;
wherein the memory further comprises operational instructions that cause the processing module to determine the multilevel signaling operational conditions by at least one of:
determining number of levels of the multilevel signaling operation;
determining bit-rate of data;
determining characteristics of a transmission path the data will traverse;
determining power consumption constraints; and
determining error correction for the data;
wherein the memory further comprises operational instructions that cause the processing module to determine the characteristics of the transmission path by at least one of:
determining distance of the transmission path;
determining a frequency response of the transmission path; and
determining impedance of the transmission path.

21. An apparatus for multilevel signal operation, the apparatus comprising:
processing module; and
memory operably coupled to the processing module, wherein the memory stores operational instructions that cause the processing module to:
determine multilevel signaling operational conditions to produce determined multilevel signaling operational conditions; and
generate an adjust signal based on the determined multilevel signaling operational conditions, wherein the adjust signal causes a magnitude of multilevel signals to be adjusted;
wherein the memory further comprises operational instructions that cause the processing module to determine the multilevel signaling operational conditions by at least one of:
determining number of levels of the multilevel signaling operation;
determining bit-rate of data;
determining characteristics of a transmission path the data will traverse;
determining power consumption constraints; and
determining error correction for the data;
wherein the memory further comprises operational instructions that cause the processing module to determine the error correction by at least one of:
determining whether forward error correction is available;
determining whether a cyclic redundancy check is available; and
determining error tolerance of the data.

22. An apparatus for multilevel signal operation, the apparatus comprising:
processing module; and
memory operably coupled to the processing module, wherein the memory stores operational instructions that cause the processing module to:
determine multilevel signaling operational conditions to produce determined multilevel signaling operational conditions; and
generate an adjust signal based on the determined multilevel signaling operational conditions, wherein the adjust signal causes a magnitude of multilevel signals to be adjusted;
wherein the memory further comprises operational instructions that cause the processing module to:
provide the adjust signal to a power supply, such that regulation of the power supply is adjusted to produce a desired supply voltage, wherein the desired supply voltage affects the magnitude of the multilevel signals.

23. An apparatus for multilevel signal operation, the apparatus comprising:
processing module; and
memory operably coupled to the processing module, wherein the memory stores operational instructions that cause the processing module to:

determine multilevel signaling operational conditions to produce determined multilevel signaling operational conditions; and generate an adjust signal based on the determined multilevel signaling operational conditions, wherein the adjust signal causes a magnitude of multilevel signals to be adjusted;

wherein the memory further comprises operational instructions that cause the processing module to:

provide the adjust signal to an amplifier, wherein gain of the amplifier is adjusted based on the adjust signal, wherein the amplifier outputs the multilevel signals.

24. An apparatus for multilevel signaling, the apparatus comprising:

processing module; and memory operably coupled to the processing module, wherein the memory includes operational instructions that cause the processing module to:

determine operational parameters for multilevel signaling to produce determined operational parameters; and determine level of the multilevel signaling based on the determined operational parameters;

wherein the memory further comprises operational instructions that cause the processing module to determine the operational parameters by at least one of:

determining receiver detection capabilities;

determining available supply level for transmission of multilevel signals;

determining bit-rate of data of the multilevel signaling;

determining characteristics of a transmission path the data will traverse;

determining power consumption constraints; and determining error correction for the data;

wherein the memory further comprises operational instructions that cause the processing module to determine the receiver detection capabilities by at least one of:

determining pre-amplification voltage levels;

determining transmission path equalization capabilities; and determining level detection precision.

25. An apparatus for multilevel signaling, the apparatus comprising:

processing module; and memory operably coupled to the processing module, wherein the memory includes operational instructions that cause the processing module to:

determine operational parameters for multilevel signaling to produce determined operational parameters; and determine level of the multilevel signaling based on the determined operational parameters;

wherein the memory further comprises operational instructions that cause the processing module to:

receive data at a first clock rate;

encode the data based on the determined level for the multilevel signaling to produce encoded multilevel data; and transmit the encoded multilevel data at a second clock rate.

26. The apparatus of claim 25, wherein the memory further comprises operational instructions that cause the processing module to encode the data by:

generating overhead data that at least includes the determined level for multilevel signaling; and encoding the overhead data based on a default level for multilevel encoding.

27. An apparatus for receiving multilevel signals, the apparatus comprises:

processing module; and memory operably coupled to the processing module, wherein the memory includes operational instructions that cause the processing module to:

determine level of multilevel signaling to produce determined level of multilevel signaling;

determine desired multilevel signaling resolution based on the determined level of multilevel signaling to produce determined multilevel resolution; and adjust magnitude of received multilevel data bas ed on the determined multilevel signaling resolution.

28. The apparatus of claim 27, wherein the memory further comprises operational instructions that cause the processing module to determine the desired multilevel signaling resolution by at least one of:

determining pre-amplification voltage levels;

determining transmission path equalization capabilities;

determining level detection precision determining bit-rate of data;

determining power consumption constraints; and determining error correction for the data.

29. The apparatus of claim 27, wherein the memory further comprises operational instructions that cause the processing module to:

receive multilevel encoded data at a first clock rate; and decode the data based on the determined level of multilevel signaling to produce decoded binary data having a second clock rate.

30. The apparatus of claim 29, wherein the memory further comprises operational instructions that cause the processing module to:

decode overhead data based on a default level for multilevel encoding to obtain the level of multilevel signaling.

31. The apparatus of claim 27, wherein the memory further comprises operational instructions that cause the processing module to determine the level of multilevel signaling by:

determining a default level for multilevel encoding.

32. The apparatus of claim 27, wherein the memory further comprises operational instructions that cause the processing module to adjust the magnitude of the received multilevel data by:

interpreting the determined multilevel signaling resolution to produce an adjust signal; and providing the adjust signal to a power supply, such that regulation of the power supply is adjusted to produce a desired supply voltage, wherein the desired supply voltage affects the magnitude of the received multilevel data.

33. The apparatus of claim 27, wherein the memory further comprises operational instructions that cause the processing module to adjust the magnitude of the received multilevel data by:

interpreting the determined multilevel signaling resolution to produce an adjust signal; and providing the adjust signal to an amplifier, wherein the gain of the amplifier is adjusted based on the adjust signal, wherein the amplifier outputs the received multilevel data.

34. A method for multilevel signal operation, the method comprises:

producing a first voltage level;

producing a second voltage level, wherein the second voltage level is greater than the first voltage level;

multilevel encoding binary data using a predetermined level of encoding to produce multilevel data, wherein the magnitude of the multilevel data ranges up to the first voltage level; and amplifying the magnitude of the multilevel data based on the second voltage level to produce amplified multilevel data, wherein magnitude of the amplified multilevel data ranges up to the second voltage level.

35. The method of claim 34 further comprises:

determining multilevel signaling operational conditions to establish the predetermined level of encoding.

36. The method of claim 35 further comprises:

generating an adjust signal based on the multilevel signaling operational conditions; and producing the second voltage level in accordance with the adjust signal.

37. The method of claim 34 further comprises:

transmitting the amplified multilevel data to a device having a multilevel decoder.

38. The method of claim 37 further comprises:

receiving the amplified multilevel data;

attenuating the magnitude of the amplified multilevel data from ranging up to the second voltage level to ranging up to the first voltage level to produce attenuated multilevel data; and multilevel decoding the attenuated multilevel data based on the predetermined level of encoding to recapture the binary data.

39. An apparatus for multilevel signal operation, the apparatus comprises:

first voltage source that provides a first voltage level;

second voltage source that provides a second voltage level, wherein the second voltage level is greater than the first voltage level;

processing module; and memory operably coupled to the processing module, wherein the memory stores operational instructions that cause the processing module to:

multilevel encode binary data using a predetermined level of encoding to produce multilevel data, wherein magnitude of the multilevel data ranges up to the first voltage level; and amplify the magnitude of the multilevel data based on the second voltage level to produce amplified multilevel data, wherein magnitude of the amplified multilevel data ranges up to the second voltage level.

40. The apparatus of claim 39, wherein the memory further comprises operational instructions that cause the processing module to:

determine multilevel signaling operational conditions to establish the predetermined level of encoding.

41. The apparatus of claim 40, wherein the memory further comprises operational instructions that cause the processing module to:

generate an adjust signal based on the multilevel signaling operational conditions; and produce the second voltage level in accordance with the adjust signal.

42. The apparatus of claim 39, wherein the memory further comprises operational instructions that cause the processing module to:

transmit the amplified multilevel data to a device having a multilevel decoder.

43. The apparatus of claim 42, wherein the memory further comprises operational instructions that cause the processing module to:

receive the amplified multilevel data;

attenuate the magnitude of the amplified multilevel data from ranging up to the second voltage level to ranging up to the first voltage level to produce attenuated multilevel data; and multilevel decode the attenuated multilevel data based on the predetermined level of encoding to recapture the binary data.

* * * * *